(12) United States Patent
Liew et al.

(10) Patent No.: US 6,608,376 B1
(45) Date of Patent: Aug. 19, 2003

(54) INTEGRATED CIRCUIT PACKAGE SUBSTRATE WITH HIGH DENSITY ROUTING MECHANISM

(75) Inventors: Wee Keong Liew, San Jose, CA (US); Aritharan Thurairajaratnam, San Jose, CA (US); Maniam Alagaratnam, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/105,863

(22) Filed: Mar. 25, 2002

(51) Int. Cl.⁷ ............................................... H01L 23/04
(52) U.S. Cl. ...................... 257/698; 257/690; 257/691; 257/700; 257/701; 257/758; 257/774
(58) Field of Search .................. 257/691, 784, 257/786, 700, 701, 758, 737, 738, 774, 690, 698

(56) References Cited

U.S. PATENT DOCUMENTS 5,672,911 A * 9/1997 Patil et al. .................. 257/691
5,691,568 A * 11/1997 Chou et al. .................. 257/691
5,814,883 A * 9/1998 Sawai et al. ................. 257/712
6,256,875 B1 * 7/2001 Watanabe et al. ............. 29/830

* cited by examiner

Primary Examiner—Nathan J. Flynn
Assistant Examiner—Pershelle Greene
(74) Attorney, Agent, or Firm—Conley, Rose & Tayon

(57) ABSTRACT

An integrated circuit package is provided that allows high density routing of signal lines. A substrate of the package may include an upper surface upon which a bonding finger resides, a lower surface upon which a solder ball resides, and a signal conductor plane on which a signal trace conductor resides a dielectrically spaced distance between the upper surface and the lower surface. A first via may extend perpendicularly from the upper surface, connecting the bonding finger to the first portion of the signal trace conductor. A second via may extend perpendicularly from the lower surface, connecting the solder ball to the second portion of the signal trace conductor. The routing of the vias and signal trace conductors may cause the signal lines to either fan into or away from the area of the integrated circuit package adapted to receive the integrated circuit.

21 Claims, 4 Drawing Sheets

INTEGRATED CIRCUIT PACKAGE SUBSTRATE WITH HIGH DENSITY ROUTING MECHANISM

BACKGROUND OF THE INVENTION

1. Field of Invention

This invention relates to integrated circuit packaging, and more particularly, to a packaging layout that provides high density routing of signal lines among a pair of signal conductor planes embedded between power and ground conductor planes.

2. Description of Related Art

The following descriptions and examples are not admitted to be prior art by virtue of their inclusion within this section.

During manufacture of an integrated circuit (e.g., a microprocessor), signal lines formed upon the silicon substrate, which are to be connected to external devices, may be formed such that these lines terminate at flat metal contact regions called input/output (I/O) pads. Following manufacture, the integrated circuit may typically be secured within a protective semiconductor device package. Each I/O pad of the integrated circuit may be connected to one or more terminals of the device package. The terminals of a device package are typically arranged about the periphery of the package. Fine metal wires may be used to connect the I/O pads of the chip to terminals of the device package. Some types of device packages have terminals called "pins" for insertion into holes in a printed circuit board (PCB). Other types of device packages have terminals called "leads" for attachment to flat metal contact regions on an exposed surface of a PCB.

As integrated circuit fabrication technology improves, manufacturers are able to integrate more and more circuits onto single silicon substrates. As the number of circuits on a single chip increases, however, the number of signal lines which need to be connected to external devices also increases. The corresponding numbers of required I/O pads and device package terminals increase as well as the complexities and costs of the device packages. Constraints of high volume PCB assembly operations place lower limits on the physical dimensions of and distances between device package terminals. As a result, the areas of peripheral-terminal device packages having hundreds of terminals are largely proportional to the number of terminals. These larger packages with fine-pitch leads are subject to mechanical damage during handling or testing. For example, mishandling may result in a loss of lead coplanarity, thereby adversely affecting PCB assembly yields. In addition, the lengths of signal lines from chip I/O pads to device package terminals increase with the number of terminals, and the high-frequency electrical performance of larger peripheral-terminal device packages suffer as a result.

Unlike more conventional peripheral-terminal device packages, grid array semiconductor device packages have terminals arranged in a two-dimensional array across the underside surface of the device package. As a result, the physical dimensions of grid array device packages having hundreds of terminals are much smaller than their peripheral-terminal counterparts. Such smaller packages are highly desirable in portable device applications such as laptop and palmtop computers and hand-held communications devices such as cellular telephones. In addition, the lengths of signal lines from the chip I/O pads to device package terminals are shorter, thus the high-frequency electrical performances of grid array device packages are typically better than those of corresponding peripheral-terminal device packages. Grid array device packages also allow the continued use of existing PCB assembly equipment developed for peripheral-terminal devices.

An increasingly popular type of grid array device package is the ball grid array (BGA) device package. A BGA device package includes a chip mounted upon a larger substrate substantially made of, for example, fiberglass-epoxy printed circuit board material or a ceramic material (e.g., aluminum oxide, alumina ($Al_2O_3$), or aluminum nitride (AlN)). Many BGA device packages have die areas dimensioned to receive integrated circuit chips and use established wire bonding techniques to electrically connect the I/O pads of the chips to corresponding flat metal "bonding fingers" adjacent to the die areas. During wire bonding, the I/O pads of the chip may be electrically connected to corresponding bonding fingers by fine metal wires (i.e., bonding wires). The substrate may include one or more layers of signal lines (i.e., signal traces or interconnects) which may connect bonding fingers to corresponding members of a set of bonding pads arranged in a two-dimensional array across the underside surface of the device package. Members of the set of bonding pads are coated with solder and function as device package terminals. The resulting solder balls on the underside of the BGA device package allow the device to be surface mounted to an ordinary PCB. During PCB assembly, the solder balls are placed in physical contact with corresponding bonding pads of the PCB. The solder balls are then heated long enough for the solder to flow. When the solder cools, the bonding pads on the underside of the chip are electrically and mechanically coupled to the bonding pads of the PCB.

A BGA device package on a plastic carrier is known as a plastic ball grid array (PBGA) device. A conventional PBGA, may include, for example, four layers of copper metal conductors separated by three dielectric layers. Normally, the top copper metal layer includes signal traces, the second copper metal layer is the ground, the third copper metal layer is the power plane, and the bottom copper metal layer is the ball pad. A die is bonded to the top of this package. The die may be wirebonded to the substrate, which may be molded to cover and protect the die and the gold wire.

As dies become more dense and complex, the signal trace density of packages also increases. There are at least two problems associated with increases in trace density. First, the area on the signal trace conductor layer may be insufficient for the required signal traces. Second, increasing signal trace density on a package may lead to increased cross talk between the signals and overall noise of the package.

SUMMARY OF THE INVENTION

The problems outlined above may be in large part addressed by a package that includes a substrate having high density routing. According to one embodiment, a semiconductor substrate may include an upper surface upon which a bonding finger resides. The semiconductor substrate may also include a lower surface upon which a solder ball resides. In addition, the semiconductor substrate may include a signal conductor plane on which a signal trace conductor resides a dielectrically spaced distance between the upper surface and the lower surface. The semiconductor substrate may further include a first via extending perpendicular to the upper surface and the signal conductor plane as a unibody structure. The first via may connect the bonding finger to a first portion of the signal trace conductor. Furthermore, the semiconductor substrate may include a second via extending perpendicular to the lower surface and the signal conductor plane as a unibody structure. The second via may connect the solder ball to a second portion of the signal trace conductor extending along the signal conductor plane from the first portion coupled thereto.

In an embodiment, the first portion may be directly below the bonding finger, and the second portion may be directly above the solder ball. The signal conductor plane may extend dielectrically between a planar power conductor and a planar ground conductor. The planar power conductor may extend a distance substantially equal to a soldermask thickness beneath the upper surface.

In an embodiment, the first via may extend a spaced distance from an inner surface of an aperture created through a portion of the planar power conductor. In an additional embodiment, the second via may extend a spaced distance from an inner surface of an aperture created through a planar power conductor arranged across a lower surface of the substrate.

In an embodiment, a semiconductor substrate may include a set of first bonding fingers spaced across an upper surface of the substrate along a first line parallel to an area adapted to receive an integrated circuit. The semiconductor substrate may also include a set of second bonding fingers spaced across the upper surface along another line parallel to the first line and farther from the area adapted to receive the integrated circuit than the first bonding fingers. Further, the semiconductor substrate may also include a set of coplanar first signal trace conductors dielectrically spaced below the upper surface and extending from a first point vertically aligned with respective first bonding fingers to a second point closer to the area adapted to receive the integrated circuit than the first point. The semiconductor substrate may further include a set of co-planar second signal trace conductors dielectrically spaced above the first signal trace conductors and extending from a third point vertically aligned with respective the second bonding fingers to a fourth point farther from the area adapted to receive the integrated circuit than the third point.

In an embodiment, a first via may electrically couple a respective pair of one of the first bonding fingers to the first point. In addition, a second via may electrically couple the second point to one of a first set of solder balls arranged on a lower surface of the substrate. A third via may electrically couple a respective pair of one of the second bonding fingers to the third point. Furthermore, a fourth via may electrically couple the fourth point to one of a second set of solder balls arranged on a lower surface of the substrate. The first set of solder balls may be closer to the area adapted to receive the integrated circuit than the second set of solder balls.

According to an embodiment, an integrated circuit package may include a first signal conductor that may be dielectrically spaced between an upper surface on which an integrated circuit is placed and a lower surface on which first and second solder balls are placed. A first signal conductor may be adapted to carry an electrical signal for a bonded finger arranged within a first row of bonding fingers extending across the upper surface to the first solder ball. The integrated circuit package may also include a second signal conductor. The second signal conductor may be adapted to carry an electrical signal from a bonded finger arranged within a second row of bonding fingers parallel to the first row and extending across the upper surface to the second solder ball. The first row of bonding fingers and the first solder ball may be closer to the integrated circuit than the second row of bonding fingers and the second solder ball.

The first signal conductor may be arranged within the first signal conductor plane, and the second signal conductor may be arranged within the second signal conductor plane. A planar ground conductor may be dielectrically spaced between the first and second signal conductor planes. The upper surface may include a first planar power conductor that may be dielectrically spaced from the first and second rows of bonding fingers and the planar ground conductor. The second planar power conductor may be dielectrically spaced between the first signal conductor plane and the first and second solder balls. The second planar power conductor may be approximately 160 $\mu$m from the first and second solder balls.

The integrated circuit package may include a single crystalline structure. The bonded fingers within the first and second rows of bonded fingers may be electrically connected to bonding pads on the integrated circuit by either wires or reflow solder. The integrated circuit package may also include an encapsulate that surrounds at least a portion of the integrated circuit and the upper surface.

There are several advantages to a semiconductor package that includes a semiconductor substrate as described in various embodiments herein. For example, a substrate, as described herein, may allow for high density routing of signal lines with a reduction of noise and cross talk. Cross talk is caused by signals from one signal line leaking over into another nearby conductor because of capacitance or inductive coupling or both. By separating the signals between two dielectrically separated signal planes, the mutual capacitance and inductance effects necessary for cross talk diminish. Further, the second signal conductor plane may be placed approximately 160 $\mu$m from the solder balls for the purpose of making the overall substrate approximately 560 $\mu$m thick. This thickness may cause the substrate to be less fragile and more easily handled during the manufacturing process, thereby facilitating manufacturing.

BRIEF DESCRIPTION OF THE DRAWINGS

Other objects and advantages of the invention will become apparent upon reading the following detailed description and upon reference to the accompanying drawings in which.

Figure 1:
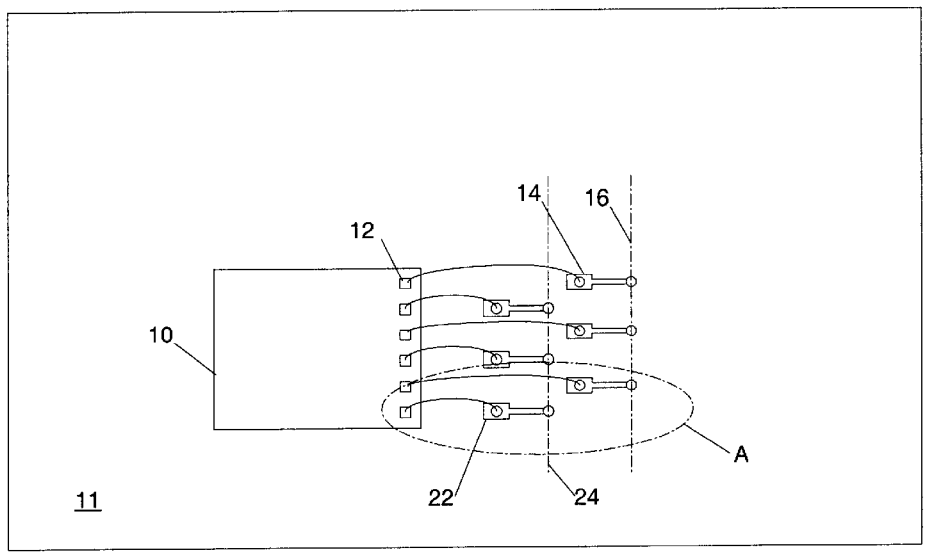
FIG. 1 is a top plan view of an integrated circuit bonded to an upper surface of a substrate, according to one example.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, FIG. 1 is a top plan view of an embodiment of integrated circuit 10 bonded to an upper surface of substrate 11. Integrated circuit 10 may be a logic device such as an application specific integrated circuit (ASIC) or a field programmable grid array (FPGA). Integrated circuit 10, however, may also be any other semiconductor device known in the art.

Integrated circuit 10 may be located substantially in the center of substrate's 11 upper surface. Integrated circuit 10, however, may be positioned in other locations on the upper surface of substrate 11. Integrated circuit 10 may include bonding pads 12, which may be located substantially at the edges of integrated circuit 10. Although only six bonding pads are shown in FIG. 1, integrated circuit 10 may include over 100 bonding pads. In addition, bonding pads 12 may be located proximate to more than one edge of integrated circuit 10. First bonding finger 22 may be coupled to bonding pad 12 by wire bonding, and first bonding finger 22 may extend to a point along first row 24 on substrate 11. First row 24 may be substantially parallel to an area adapted to receive integrated circuit 10. Second bonding finger 14 may be coupled to bonding pad 12 by wire bonding, and second bonding finger 14 may extend to a point along second row 16 on the substrate. Second row 16 may be substantially parallel to an area adapted to receive integrated circuit 10. First row 24 may be closer to the area adapted to receive integrated circuit 10 than second row 16.

Figure 2:
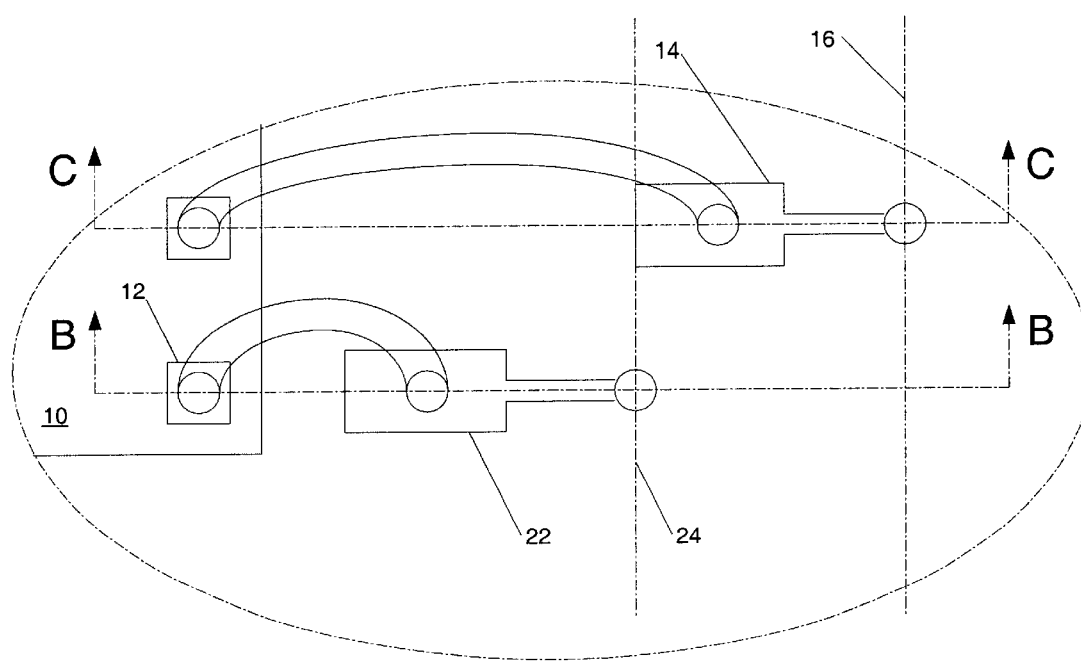
FIG. 2 is a detailed plan view along area A of FIG. 1, illustrating a wire bond configuration between respective bonding pads on the integrated circuit and bonding fingers on the substrate.

FIG. 2 is a detailed plan view along area A of FIG. 1, illustrating a wire bond configuration between respective bonding pads 12 on integrated circuit 10 and first bonding finger 14 and second bonding finger 22 on the substrate.

Figure 3A:
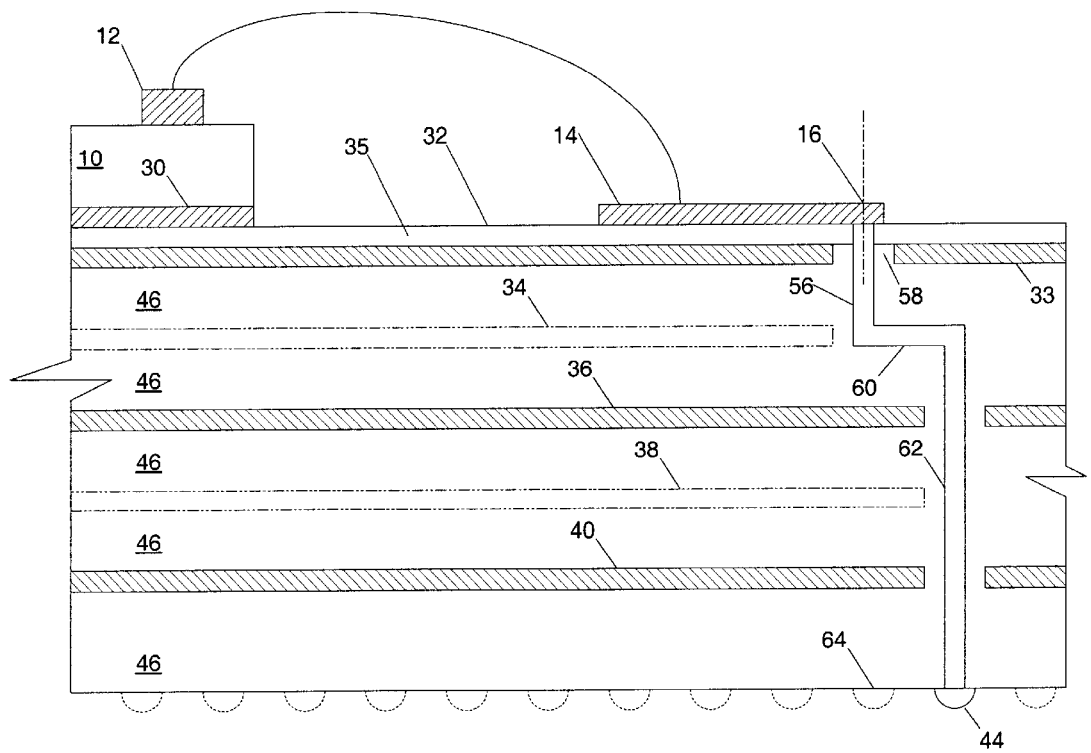
FIG. 3a is a cross-sectional view along plane B of FIG. 2, illustrating fan out of a trace conductor configured in an outer row on the upper surface of the substrate to a solder ball on the lower surface of the substrate.

FIG. 3a is a cross-sectional view along plane C of FIG. 2, illustrating fan out of a trace conductor coupled to bonding finger 14 at a point proximate to second row 16 on upper surface 32 of the substrate and to second solder ball 44 on lower surface 64 of the substrate. Integrated circuit 10 may be attached to upper surface 32 of the substrate by adhesive 30. Adhesive 30 may include solder, organic adhesives (such as epoxies or polyrnides), or glass adhesives (such as silver-filled specialty glass materials). Adhesive 30, however, may also include any other adhesive known in the art. Third via 56 may extend substantially perpendicular from upper surface 32 to second signal conductor 60. Second signal conductor 60 may include copper, silver, gold, tungsten, molybdenum, platinum, palladium, nickel, chromium, invar, kovar, silver-palladium, gold-palladium, aluminum, gold-tin (20%), or lead-tin (5%). Third via 56 and fourth via 62 may include similar materials as second signal conductor 60. Second signal conductor 60, however, may also include any other conductor known in the art.

Third via 56 may extend a spaced distance from an inner surface of aperture 58 through a portion of first planar power conductor 33. Second signal conductor 60 may be dielectrically spaced from upper surface 32 by dielectric 46 and may be arranged on second signal conductor plane 34. Dielectric 46 may include Bismaleimide/Triazine (BT) or Preimpregnated Glass Cloth (Prepeg). Dielectric 46, however, may also include any other dielectric known in the art. Fourth via 62 may extend substantially vertical from second signal conductor 60 to second solder ball 44. In this embodiment, fourth via 62 may extend substantially vertical through planar ground conductor 36, and second planar power conductor 40 to second solder ball 44.

Soldermask 35 may be formed upon first planar power conductor 33. In addition, second bonding finger 14 may be formed upon soldermask 35. First planar power conductor 33 may be spaced by dielectric 46 from planar ground conductor 36. First planar power conductor 33 may also extend a distance substantially equal to soldermask 35 thickness beneath upper surface 32. Planar ground conductor 36 may be spaced by dielectric 46 between first signal conductor plane 38 and second signal conductor plane 34.

Routing of third via 56, second signal conductor 60, and fourth via 62 cause second solder ball 44 to be farther from the area adapted to receive integrated circuit 10 than second row 16.

Figure 3B:
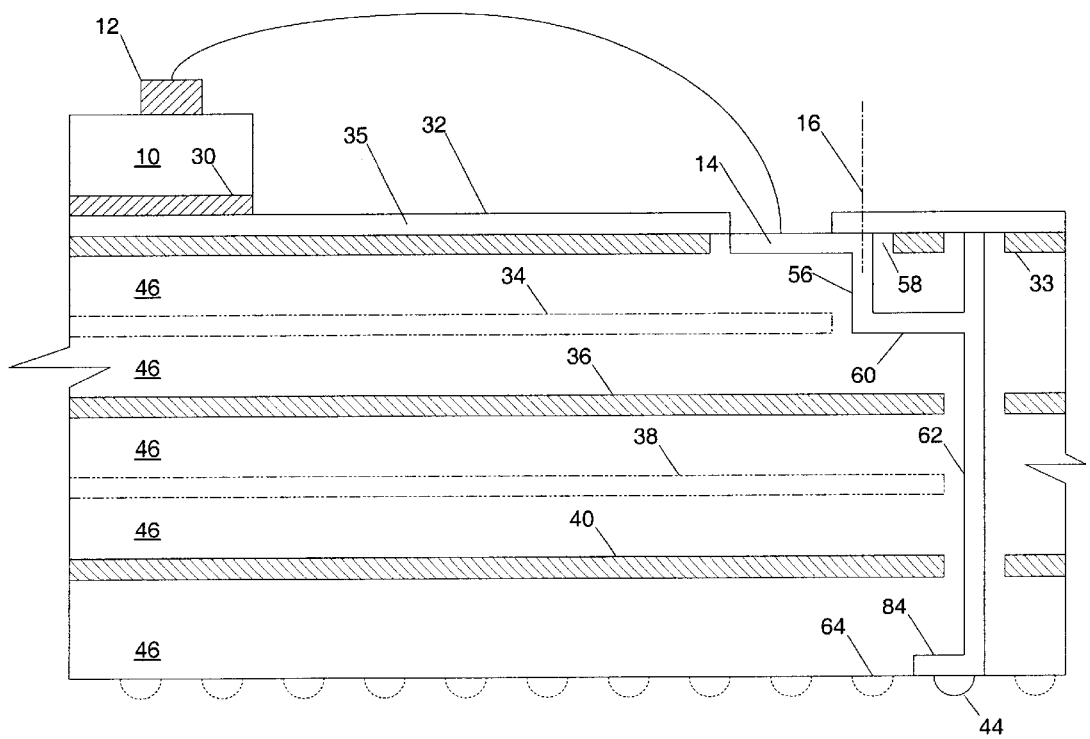
FIG. 3b is a cross-sectional view along plane B of FIG. 2, illustrating an additional embodiment of the fan out of a trace conductor configured in an outer row on the upper surface of the substrate to a solder ball on the lower surface of the substrate.

FIG. 3b is a cross-sectional view along plane B of FIG. 2, illustrating an additional embodiment of the fan out of a trace conductor configured in an outer row on the upper surface of the substrate to a solder ball on the lower surface of the substrate. In this embodiment, bonding finger 14 is spaced between soldermask 35 and dielectric 46. Fourth via 62 may extend from top soldermask to lower surface 64 of the substrate. In this embodiment, ball pad trace 84 extends from fourth via 62 to above second solder ball 44. The embodiment illustrated in FIG. 3b may be further configured as described herein.

Figure 4:
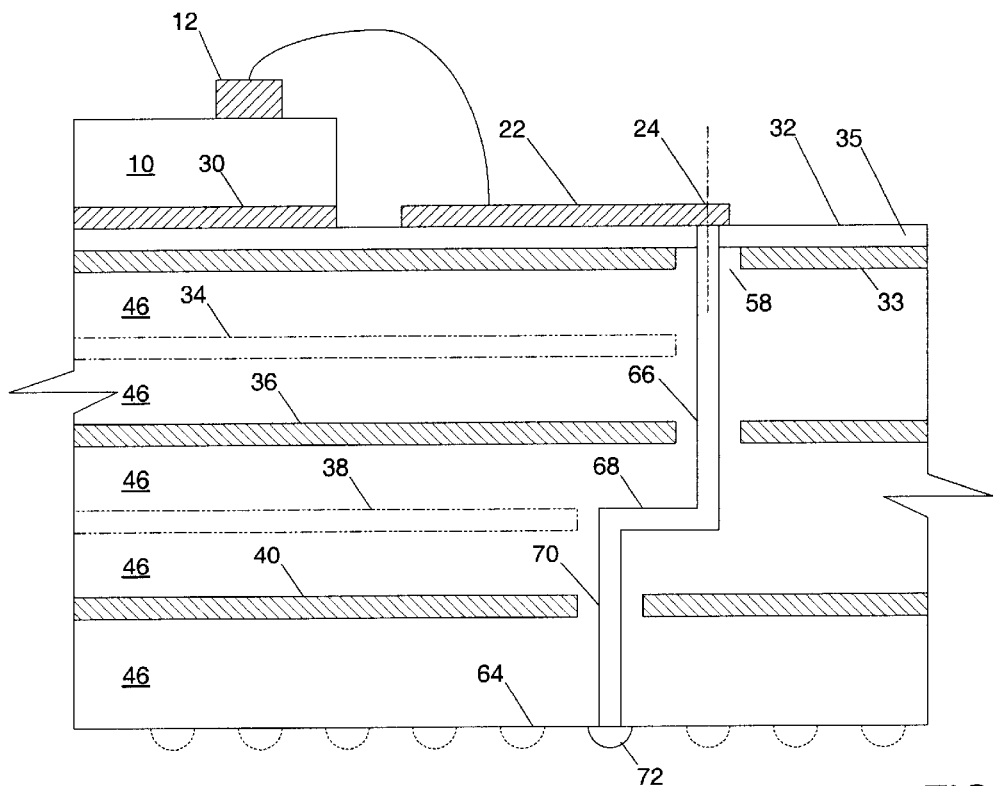
FIG. 4 is a cross-sectional view along plane C of FIG. 2, illustrating fan in of a race conductor configured in an inner row of the upper surface of the substrate to a solder all on the lower surface of the substrate.

FIG. 4 is a cross-sectional view along plane B of FIG. 2, illustrating fan in of a trace conductor coupled to bonding finger 22 at a point proximate to first row 24 on upper surface 32 of the substrate to first solder ball 72 on lower surface 64 of the substrate. As described above, integrated circuit 10 may be attached to upper surface 32 of the substrate by adhesive 30. First via 66 may extend substantially perpendicular from upper surface 32 to first signal conductor 68. First via 66 may extend a spaced distance from an inner surface of aperture 58 through a portion of first planar power conductor 33, and planar ground conductor 36. First signal conductor 68 may be dielectrically spaced from upper surface 32 and may be arranged on first signal conductor plane 38. Second via 70 may extend substantially vertical from first signal conductor 68 to first solder ball 72. First signal conductor 68, first via 66, and second via 70 may include similar materials as second signal conductor 60. In this embodiment, second via 70 may extend substantially vertical through second planar power conductor 40, before connecting to first solder ball 72.

Soldermask 35 may have a thickness of approximately 20–40 $\mu$m, and soldermask 35 thickness may be, for example, about 30 $\mu$m. First planar power conductor 33 may have a thickness of approximately 20–40 $\mu$m, and first planar power conductor 33 thickness may be, for example, about 27 $\mu$m. First planar power conductor may be spaced approximately 40–80 $\mu$m by dielectric 46 from second signal conductor plane 34. Second signal conductor plane 34 may have a thickness of approximately 5–20 $\mu$m, and second signal conductor 34 thickness may be, for example, about 12 µm. Second signal conductor plane 34 may be spaced approximately 40–80 µm by dielectric 46 from planar ground conductor 36. Planar ground conductor 36 may have a thickness of approximately 5–20 µm, and planar ground conductor 36 thickness may be, for example, about 12 µm. Planar ground conductor 36 may be spaced approximately 40–80 µm by dielectric 46 from first signal conductor plane 38. First signal conductor plane 38 may have a thickness of approximately 5–20 µm, and first signal conductor 38 thickness may be, for example, about 12 µm. First signal conductor plane 38 may be spaced approximately 40–80 µm by dielectric 46 from second planar power conductor 40. Second planar power conductor 40 may have a thickness of approximately 5–20 µm, and second planar power conductor 40 thickness may be, for example, about 12 µm. Second planar power conductor 40 may be spaced approximately 160 µm by dielectric 46 from lower surface 64 on which second solder ball 44 resides. Second solder ball 44 may have a thickness of approximately 20–40 µm, and second solder ball 44 thickness may be, for example, about 27 µm. A second soldermask may also be applied to second solder ball 44. The second soldermask may have a thickness of approximately 20–50, and second soldermask thickness may be, for example, about 30 µm. The sum of the aforementioned dimensions may yield a substrate having a thickness of about 560 µm. The thickness of about 560 µm may cause the substrate to be less fragile and more easily handled during the manufacturing process, thereby facilitating manufacturing. The thicknesses given above may vary, however, depending upon various factors, including but not limited to, the materials of the elements.

Routing of first via 66, first signal conductor 68, and second via 70 cause first solder ball 72 to be closer to the area adapted to receive integrated circuit 10 than first row 24.

Figure 5:
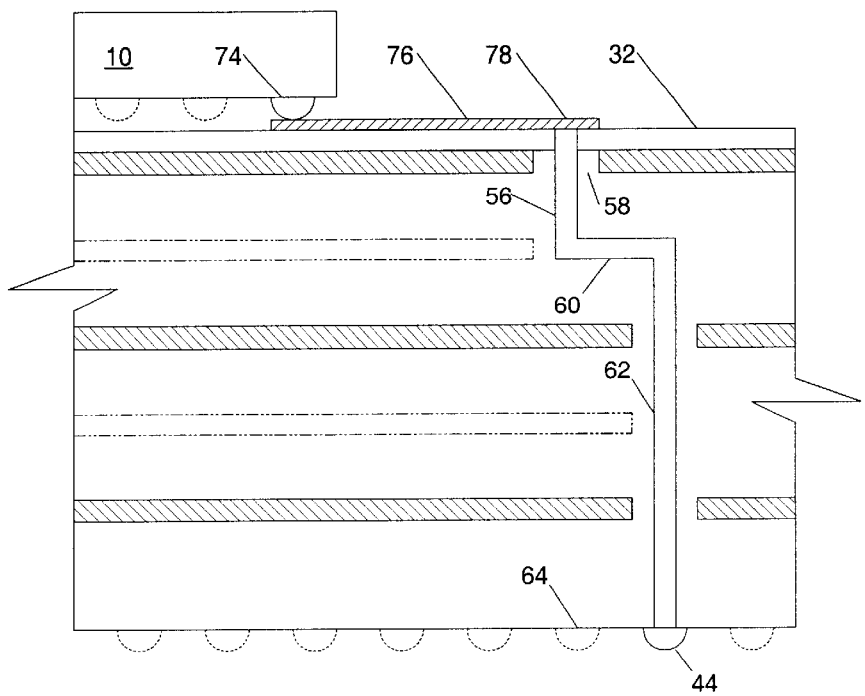
FIG. 5 is a cross-sectional view of an embodiment of an integrated circuit bonded to an upper surface of a substrate, illustrating the fan out of a trace conductor in a flip chip configuration.

FIG. 5 is a cross-sectional view of an embodiment of integrated circuit 10 bonded to upper surface 32 of a substrate, illustrating the fan out of a trace conductor in a flip chip configuration. Flip chip configuration uses a grid of conductive bumps 74 on the surface of the active area of integrated circuit 10 rather than a row of bond pads 12 on the perimeter. The integrated circuit 10 is then flipped face down (hence the name "Flip chip") and the conductive bumps are jointed directly to a corresponding set of solder pads on the substrate.

This embodiment is similar to that shown in FIG. 3a, except that integrated circuit 10 is in a flip chip configuration. Therefore, elements that may be similarly configured in the embodiments of FIGS. 3 and 5 have been indicated by the same reference numbers. In this embodiment, conductive bump 74 may be connected to surface trace 76 on upper surface 32 of the substrate. The material of conductive bump 74 may be solder, plated nickel-gold, gold or cured adhesive. Surface trace 76 may terminate at entry point 78.

Like the embodiment in FIG. 3a, in this embodiment, routing of third via 56, second signal conductor 60, and fourth via 62 cause second solder ball 44 to be farther from the area adapted to receive integrated circuit 10 than entry point 78.

Figure 6:
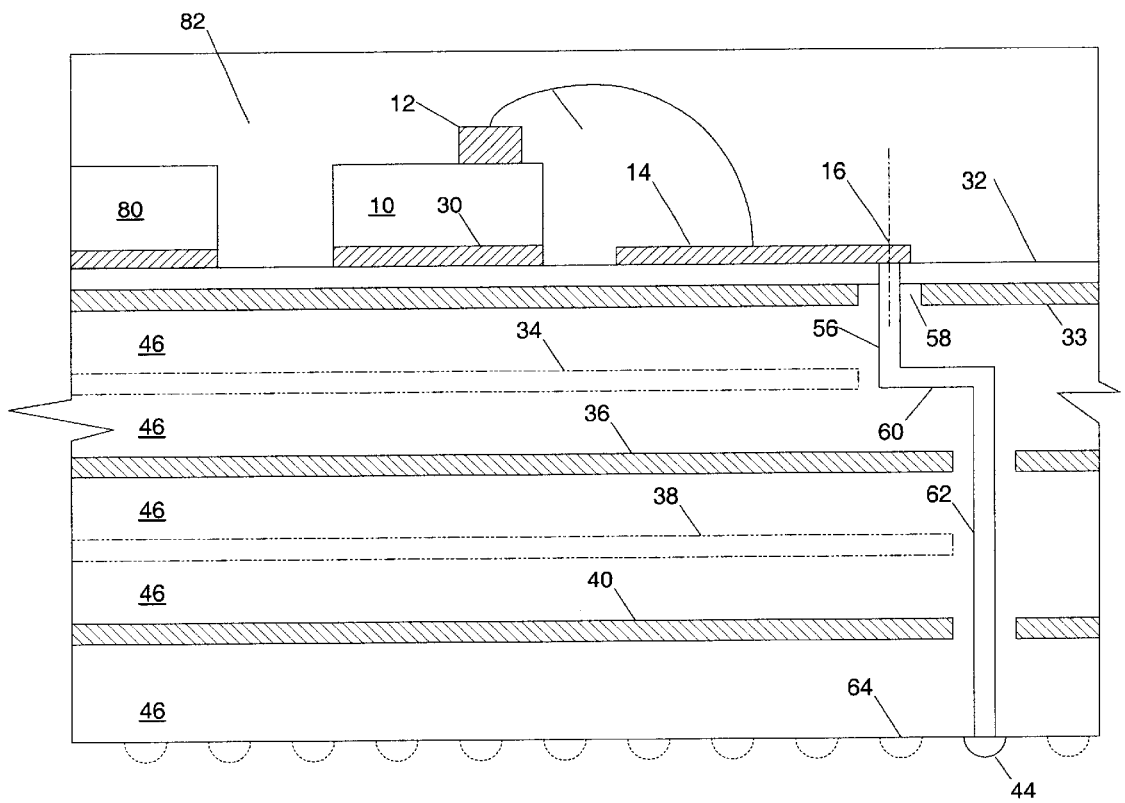
FIG. 6 is a cross-sectional view of an embodiment of an integrated circuit bonded to an upper surface of a substrate, illustrating the fan out of a trace conductor in a multichip module configuration.

FIG. 6 is a cross-sectional view of an embodiment of integrated circuit 10 bonded to upper surface 32 of a substrate, illustrating the fan out of a trace conductor in a multi-chip module configuration. Multi-chip module configuration may use multiple unpackaged integrated circuits 10 integrated on a single substrate. For example, a multi-chip module may combine as many as 13 integrated circuits 10 on a single 2-inch by 2-inch substrate.

This embodiment is similar to the embodiment shown in FIG. 5, except that in this embodiment second integrated circuit 80 may also be attached to the substrate. Therefore, elements that may be similarly configured in the embodiments of FIGS. 3 and 5 have been indicated by the same reference numbers. Additional integrated circuits may also be attached to the substrate. Integrated circuit 10, second integrated circuit 80, and any additional integrated circuits may be separated by an encapsulate 82, which acts as an insulator.

It will be appreciated by those skilled in the art having the benefit of this disclosure that this invention is believed to present an integrated circuit package substrate that provides high density routing. Further modifications and alternative embodiments of various aspects of the invention will be apparent to those skilled in the art in view of this description. Details described herein, such as materials or dimensions are exemplary of a particular embodiment. It is intended that the following claims be interpreted to embrace all such modifications and changes and, accordingly, the specification and drawings are to be regarded in an illustrative rather than a restrictive sense.

What is claimed is:

1. A semiconductor substrate, comprising:
    an upper surface upon which a bonding finger resides;
    a lower surface upon which a solder ball resides;
    a signal conductor plane on which a signal trace conductor resides a dielectrically spaced distance between the upper surface and the lower surface;
    a first via extending perpendicular to the upper surface and the signal conductor plane as a unibody structure which connects the bonding finger to a first portion of the signal trace conductor; and
    a second via extending perpendicular to the lower surface and the signal conductor plane as a unibody structure which connects the solder ball to a second portion of the signal trace conductor extending along the signal conductor plane from the first portion coupled thereto.

2. The semiconductor substrate as recited in claim 1, wherein the first portion is directly below the bonding finger.

3. The semiconductor substrate as recited in claim 1, wherein the second portion is directly above the solder ball.

4. The semiconductor substrate as recited in claim 1, wherein the signal conductor plane extends dielectrically between a planar power conductor and a planar ground conductor.

5. The semiconductor substrate as recited in claim 1, wherein the first via extends a spaced distance from an inner surface of an aperture created through a portion of the planar power conductor.

6. The semiconductor substrate as recited in claim 1, wherein the second via extends a spaced distance from an inner surface of an aperture created through a planar power conductor arranged across a lower surface of the substrate.

7. A semiconductor substrate, comprising:
    a set of first bonding fingers spaced across an upper surface of the substrate along a first line parallel to an area adapted to receive an integrated circuit;
    a set of second bonding fingers spaced across the upper surface along another line parallel to the first line and farther from the area adapted to receive the integrated circuit than the first bonding fingers;
    a set of co-planar first signal trace conductors dielectrically spaced below the upper surface and extending from a first point vertically aligned with respective said first bonding fingers to a second point closer to the area adapted to receive the integrated circuit than the first point; and a set of co-planar second signal trace conductors dielectrically spaced above the first signal trace conductors and extending from a third point vertically aligned with respective said second bonding fingers to a fourth point farther from the area adapted to receive the integrated circuit than the third point.

8. The semiconductor substrate as recited in claim 7, further comprising a first via and a second via, wherein the first via electrically couples a respective pair of one of said first bonding fingers to the first point and the second via electrically couples the second point to one of a first set of solder balls arranged on a lower surface of the substrate.

9. The semiconductor substrate as recited in claim 8, further comprising a third via and a fourth via, wherein the third via electrically couples a respective pair of one of said second bonding fingers to the third point and the fourth via electrically couples the fourth point to one of a second set of solder balls arranged on a lower surface of the substrate.

10. The semiconductor substrate as recited in claim 9, wherein the first set of solder balls are closer to the area adapted to receive the integrated circuit than the second set of solder balls.

11. An integrated circuit package, comprising:

a first signal conductor dielectrically spaced between an upper surface on which an integrated circuit is placed and a lower surface on which a first and second solder ball is placed, wherein the first signal conductor is adapted to carry an electrical signal from a bonded finger arranged within a first row of bonding fingers extending across the upper surface to the first solder ball;

a second signal conductor dielectrically spaced from the first signal conductor, wherein the second signal conductor is adapted to carry an electrical signal from a bonded finger arranged within a second row of bonding fingers parallel to the first row and extending across the upper surface to- the second solder ball; and wherein the first row of bonding fingers and the first solder ball are closer to the integrated circuit than the second row of bonding fingers and the second solder ball.

12. The integrated circuit package as recited in claim 11, wherein the first signal conductor is arranged within a first signal conductor plane, and wherein the second signal conductor is arranged within a second signal conductor plane.

13. The integrated circuit package as recited in claim 11, further comprising a planar ground conductor dielectrically spaced between the first and second signal conductor planes.

14. The integrated circuit package as recited in claim 11, wherein the upper surface comprises a planar power conductor dielectrically spaced from the first and second rows of bonding fingers and the planar ground conductor.

15. The integrated circuit package as recited in claim 11, wherein the integrated circuit comprises a single crystalline structure.

16. The integrated circuit package as recited in claim 11, wherein the bonded fingers within the first and second rows of fingers are electrically connected to bonding pads on the integrated circuit by wires.

17. The integrated circuit package as recited in claim 11, further comprising encapsulate surrounding at least a portion of the integrated circuit and the upper surface.

18. The integrated circuit package as recited in claim 11, wherein a second power planar power conductor is dielectrically spaced between the first signal conductor plane and the first and second solder balls.

19. The integrated circuit package as recited in claim 11, wherein the second planar power conductor is approximately 160 μm from the first and second solder balls.

20. The semiconductor substrate as recited in claim 4, wherein the planar power conductor extends a distance substantially equal to a soldermask thickness beneath the upper surface.

21. The integrated circuit package as recited in claim 11, wherein the bonded fingers within the first and second rows of fingers are electrically connected to bonding pads on the integrated circuit by reflow solder.

\* \* \* \* \*